(12) United States Patent
Nishi

(10) Patent No.: US 6,788,521 B2
(45) Date of Patent: Sep. 7, 2004

(54) CAPACITOR AND METHOD FOR FABRICATING THE SAME

(75) Inventor: Masahiro Nishi, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 10/254,836

(22) Filed: Sep. 26, 2002

(65) Prior Publication Data

US 2003/0063428 A1 Apr. 3, 2003

(30) Foreign Application Priority Data

Sep. 28, 2001 (JP) .......................................... 2001-299816

(51) Int. Cl.$^7$ .............................. H01G 4/30; H01G 4/06
(52) U.S. Cl. ...................... 361/301.4; 361/313; 257/303
(58) Field of Search .................................. 257/308–312, 257/301, 303, 306; 361/311–313, 320, 321.4, 322, 306.4

(56) References Cited

U.S. PATENT DOCUMENTS

| | | | | |
|---|---|---|---|---|
| 5,293,510 A | * | 3/1994 | Takenaka | 257/295 |
| 5,811,851 A | * | 9/1998 | Nishioka et al. | 257/310 |
| 6,051,859 A | * | 4/2000 | Hosotani et al. | 257/306 |
| 6,184,551 B1 | * | 2/2001 | Lee et al. | 257/310 |
| 6,215,646 B1 | * | 4/2001 | Ochiai et al. | 361/301.4 |

FOREIGN PATENT DOCUMENTS

| | | |
|---|---|---|
| JP | 05-343613 A | 12/1993 |
| JP | 08-181282 A | 7/1996 |
| JP | 09-121020 A | 5/1997 |
| JP | 2000-228497 A | 8/2000 |

OTHER PUBLICATIONS

Copy of Office Action dated Sep. 9, 2003 from Japanese Patent Office in Application No. 0100322.

* cited by examiner

Primary Examiner—Dean A. Reichard
Assistant Examiner—Eric Thomas
(74) Attorney, Agent, or Firm—Westerman, Hattori, Daniels & Adrian, LLP

(57) ABSTRACT

A capacitor which includes a lower electrode 12 formed on a substrate 10; an insulation film 16 having an opening 24 on the lower electrode 12; a capacitor dielectric film 30 formed on the lower electrode 12 in the opening 24 and having a larger thickness at a peripheral part of the opening 24 than at a central part of the opening; and an upper electrode 32 formed on the capacitor dielectric film 30. Thus, degradation of the breakdown voltage and stress resistance of the peripheral part of the opening 24, which is due to the coverage of the capacitor dielectric film, can be suppressed.

5 Claims, 15 Drawing Sheets

CAPACITOR AND METHOD FOR FABRICATING THE SAME

BACKGROUND OF THE INVENTION

The present invention relates to a capacitor for use in semiconductor integrated circuit devices for communication, etc. and a method for fabricating the capacitor.

Semiconductor integrated circuit devices for communication include a large number of capacitors having large areas and large capacitances. Accordingly, it is important how to increase breakdown voltage yield and reliability of the capacitors.

A conventional method for fabricating a capacitor used in semiconductor integrated circuit devices for communication will be explained with reference to FIGS. 14A–14C and 15A–15B.

An Au (gold) film, for example, is deposited on a substrate 100 and patterned to form a lower electrode 102 (FIG. 14A).

Next, a silicon nitride film 104 which functions as an interconnection cover film and a capacitor dielectric film is formed on the substrate 100 with the lower electrode 102 formed on (FIG. 14B).

Then, an inter-layer insulation film 106 of benzocyclobutene (hereinafter also called BCB) or polyimide (hereinafter also called PI) is formed on the silicon nitride film 104.

Then, a silicon nitride film 108 is deposited on the inter-layer insulation film 106 and patterned (FIG. 14C).

Next, with the silicon nitride film 108 as a mask, the inter-layer insulation film 106 is etched to form an opening 110 reaching the silicon nitride film 104 (FIG. 15A). The etching of the inter-layer insulation film 106 is, e.g., plasma etching using a gas of oxygen with a trace of fluorine-based gas added to. The plasma etching is followed by wet processing using a hydrofluoric acid-based chemical solution as processing for removing residual silicon produced upon the etching.

Then, an upper electrode 112 is formed on the silicon nitride film 104 exposed in the opening 110, extended over the inter-layer insulation film 106 (FIG. 15B).

A capacitor comprising the lower electrode 102, the capacitor dielectric film of the silicon nitride film 104 and the upper electrode 112 has been thus fabricated.

In the above-described method for fabricating conventional capacitor, in etching the inter-layer insulation film 106 to form the opening 110, the lower silicon nitride film 104 is exposed to the etching atmosphere. Considering fluctuation of film thickness, etc., a prescribed over etching is conducted in etching the inter-layer insulation film 106.

Accordingly, the silicon nitride film 104 is damaged in etching the inter-layer insulation film 106. Resultantly, the silicon nitride film 104 has distributed film decreases or is damaged, which has made it impossible to form a capacitor of high accuracy and reliability.

SUMMARY OF THE INVENTION

An object of the present invention is to provide a capacitor having high capacitance value controllability and reliability, and a method for fabricating the capacitor.

According to one aspect of the present invention, there is provided a capacitor comprising: a lower electrode formed on a substrate; an insulation film formed on the substrate with the lower electrode formed on, and having an opening on the lower electrode; a capacitor dielectric film formed on the lower electrode in the opening, and having a larger film thickness at a peripheral part of the opening than at a central part of the opening; and an upper electrode formed on the capacitor dielectric film.

According to another aspect of the present invention, there is provided a capacitor comprising: a lower electrode formed on a substrate; a first insulation film formed on the substrate with the lower electrode formed on, and having a first opening on the lower electrode; a second insulation film formed on the first insulation film, and having a second opening in a region where the first opening is formed; a capacitor dielectric film formed on the lower electrode in the opening, and extended over the second insulation film; and an upper electrode formed on the capacitor dielectric film.

According to further another aspect of the present invention, there is provided a method for fabricating a capacitor comprising the steps of: forming a lower electrode on a substrate; forming a first insulation film on the substrate with the lower electrode formed on; forming a second insulation film on the first insulation film; forming an opening reaching the lower electrode in the first insulation film and the second insulation film; forming a capacitor dielectric film on the lower electrode, extended over the second insulation film; and forming an upper electrode on the capacitor dielectric film.

As described above, according to the present invention, the capacitor dielectric film is formed after the opening for exposing the lower electrode is formed in the inter-layer insulation film 16, whereby the capacitor dielectric film can be kept from being exposed to the etching atmosphere. Thus, the intra-distribution and fluctuation of the film thickness of the capacitor dielectric film, and degradation of the film quality can be prevented.

The capacitor dielectric film is thicker selectively at a peripheral part of the opening formed in the inter-layer insulation film, whereby degradation of breakdown voltage, stress resistance, etc. due to the coverage of the capacitor dielectric film can be suppressed.

The opening is formed in the inter-layer insulation film in a large area containing a region for the lower electrode formed in, whereby even when the peripheral part of the opening has parts of poor coverage of the capacitor dielectric film, the parts are away from between the lower electrode and the upper electrode. Accordingly, the capacitor dielectric film can be highly reliable in breakdown voltage, stress resistance, etc.

DETAILED DESCRIPTION OF THE INVENTION

[A First Embodiment]

The capacitor and the method for fabricating the same according to a first embodiment of the present invention will be explained with reference to FIGS. 1, 2A–2D, and 3A–3D.

Figure 1:
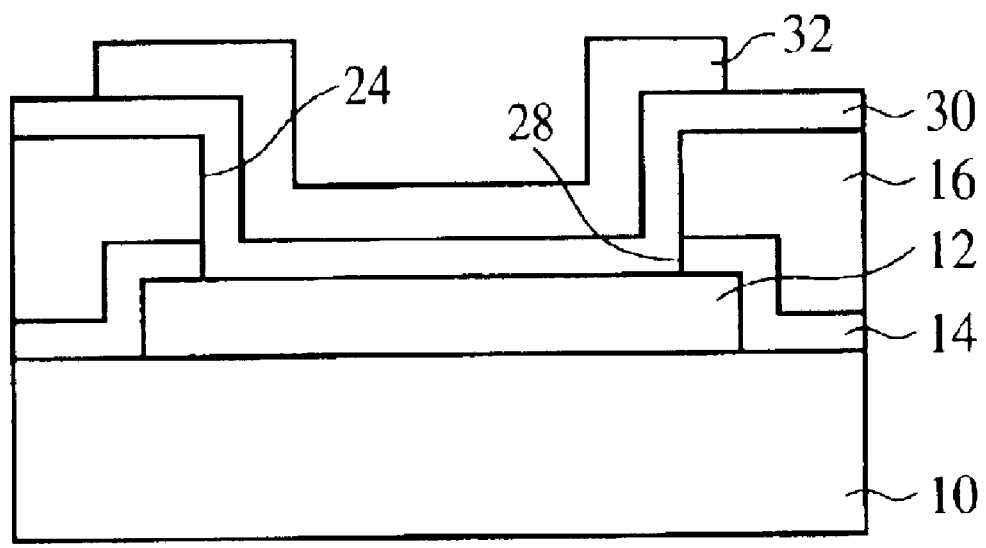
FIG. 1 is a diagrammatic sectional view of the capacitor according to a first embodiment of the present invention, which shows a structure thereof.

FIG. 1 is a diagrammatic sectional view of the capacitor according to the present embodiment, which shows a structure thereof. FIGS. 2A–2D and 3A–3D are sectional views of the capacitor according to the present embodiment in the steps of the method for fabricating the same, which show the method.

First, a structure of the capacitor according to the present embodiment will be explained with reference to FIG. 1.

A lower electrode 12 is formed on a substrate 10. A silicon nitride film 14 having an opening 28 on the lower electrode 12 is formed on the substrate 10 with the lower electrode 12 formed on. An inter-layer insulation film 16 with an opening 24 having substantially the same diameter as the opening 28 formed in is formed on the silicon nitride film 14. A capacitor dielectric film 30 is formed on the lower electrode 12 exposed in the openings 24, 28, extended over the inter-layer insulation film 16. An upper electrode 32 is formed on the capacitor dielectric film 30.

As described above, the capacitor according to the present embodiment is characterized mainly in that the silicon nitride film 14 in the opening 24 is removed, and the capacitor dielectric film 30 formed on the lower electrode 12 is extended over the inter-layer insulation film 16. That is, in the capacitor according to the present embodiment, the openings 24, 28 reaching the lower electrode 12 are formed through the inter-layer insulation film 16 and the silicon nitride film 14, and then the capacitor dielectric film 30 is formed. Accordingly, the capacitor dielectric film 30 is not damaged in the process of forming the openings 24, 28, whereby no intra-plane distribution and fluctuation of the film thickness take place, and degradation of the film quality can be prevented.

Next, the method for fabricating the capacitor according to the present embodiment will be explained with reference to FIGS. 2A–2D and 3A–3D.

First, an 300 nm-thick Au (gold) film, for example, is deposited on a substrate 10 by, e.g., sputtering method. In the specification of the present application, the "substrate" means not only the substrate itself, such a semiconductor wafer or others, but also the substrate with the elements, e.g. transistors, and interconnection layers formed on.

Figure 2A:
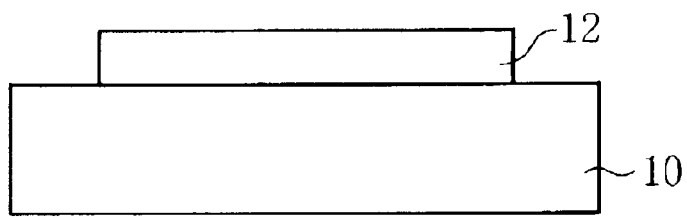
FIGS. 2A–2D and 3A–3D are sectional views of the capacitor according to the first embodiment of the present invention in the steps of the method for fabricating the same, which show the method.

Then, the Au film is patterned to form the lower electrode 12 (FIG. 2A). The lower electrode 12 may be formed of the same conducting layer forming an interconnection layer (not shown).

Figure 2B:
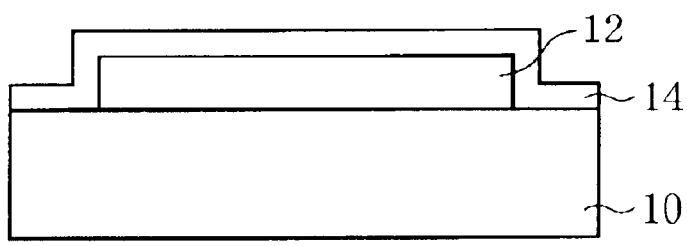

Then, a silicon nitride film 14 of, e.g., a 200 nm-thick is formed by, e.g., CVD method on the substrate 10 with the lower electrode 12 formed on (FIG. 2B). The silicon nitride film 14 functions also as an interconnection cover film for the interconnection layer, which is formed in a region not shown concurrently with forming the lower electrode 12. The interconnection cover film is a film for making good adhesion between the interconnection layer and the inter-layer insulation film 16 to be formed above the interconnection layer, and high electron-migration resistance of the interconnection layer.

Then, the inter-layer insulation film 16 of a benzocyclobutene (BCB) film or a polyimide (PI) film of, e.g., a 2000 nm-thick is formed on the silicon nitride film 14 by, e.g., spin coating method.

Figure 2C:
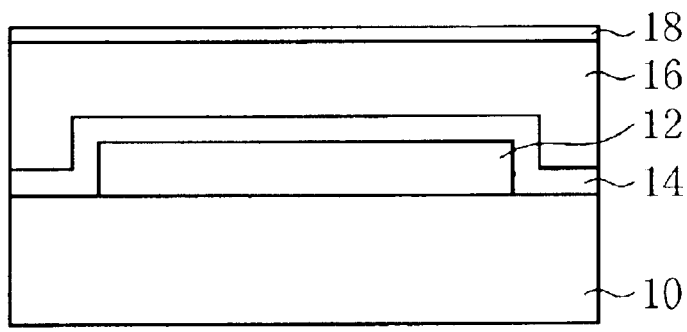

Next, a silicon nitride film 18 of, e.g., a 300 nm-thick is deposited on the inter-layer insulation film 16 by, e.g., CVD method (FIG. 2C). The silicon nitride film 18 is a film to be used as a mask for patterning the inter-layer insulation film 16 in a later step.

Then, a resist pattern 22 having an opening 20 for exposing a region above the lower electrode 12 is formed on the silicon nitride film 18 by photolithography.

Figure 2D:
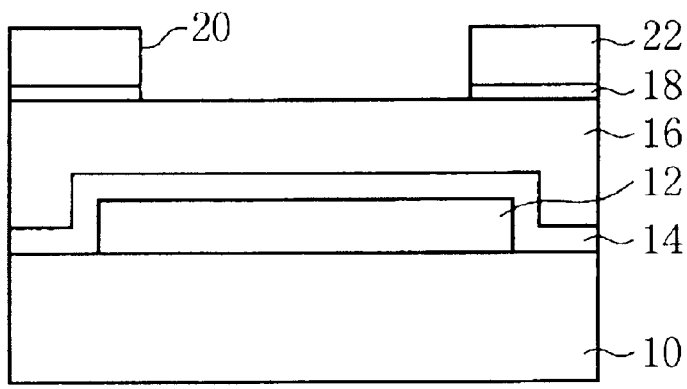

Then, the silicon nitride film 18 is anisotropically etched with the resist pattern 22 as a mask to remove the silicon nitride film 18 in the opening 20 (FIG. 2D). The silicon nitride film 18 can be etched by plasma etching using a fluorine-based gas. The silicon nitride film 18 is etched, e.g., by using $SF_6$ as the fluorine-based gas, at a gas flow rate of $SF_6/CHF_3$ =20 sccm/20 sccm, at 1 Pa chamber internal pressure and a 100 W radio-frequency electric power.

Figure 3A:
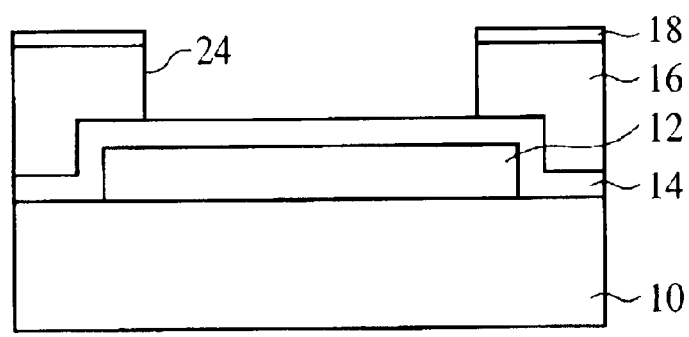

Next, the resist pattern 22 is removed, and then, with the patterned silicon nitride film 18 as a mask, the inter-layer insulation film 16 is anisotropically etched by plasma etching using, e.g., oxygen gas. The inter-layer insulation film 16 is etched, e.g., at a gas flow rate of $O_2/CHF_3$=30 sccm/3 sccm, at a 1 Pa chamber internal pressure and a 200 W radio-frequency electric power. Thus, the opening 24 reaching the silicon nitride film 14 is formed in the inter-layer insulation film 16 (FIG. 3A).

Figure 3B:
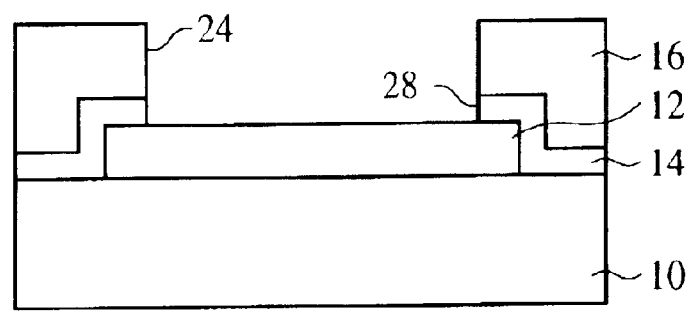

Then, the silicon nitride film 18, and the silicon nitride film 14 exposed in the opening 24 are selectively etched by plasma etching using, e.g., a fluorine-based gas. Thus, the silicon nitride film 18 is removed while the opening 28 is formed in the silicon nitride film 14, and the lower electrode 12 is exposed in the opening 28 (FIG. 3B).

Concurrently with forming the openings 24, 28, a via hole reaching the interconnection layer formed in the region not shown may be formed.

Figure 3C:
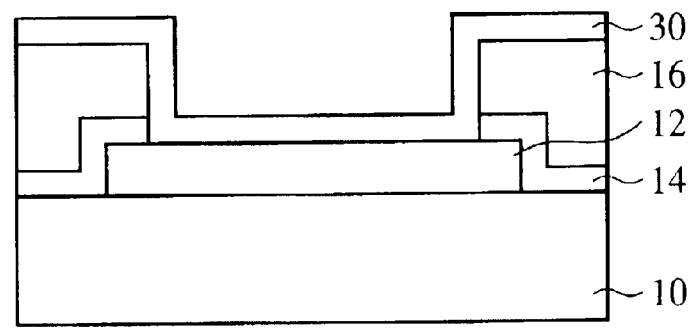

Next, a silicon nitride film of, e.g., a 200 nm-thick is deposited by, e.g., CVD method. Thus, the capacitor dielectric film 30 of the silicon nitride film is formed (FIG. 3C).

Then, an Au film of, e.g., a 1000 nm-thick is deposited on the capacitor dielectric film 30.

Figure 3D:
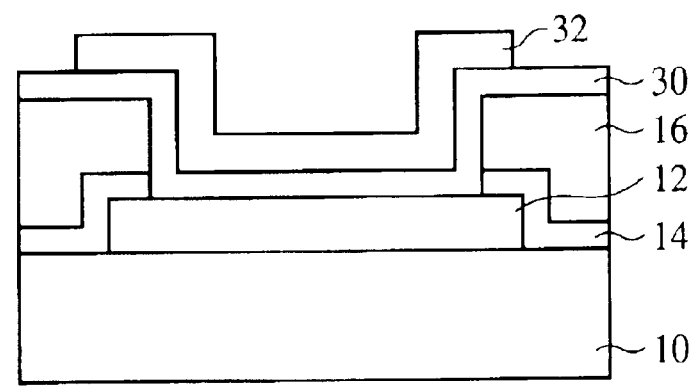

Next, the Au film is patterned to form the upper electrode 32 (FIG. 3D).

Concurrently with forming the upper electrode 32, an interconnection layer (not shown) may be formed, connected to the lower interconnection layer through the via hole formed through the silicon nitride film 14 and the inter-layer insulation film 16. In this case, after the capacitor dielectric film 30 has been formed and before the upper electrode is formed, the capacitor dielectric film 30 in the region for the via hole formed in is removed in advance.

Thus, the capacitor according to the present embodiment can be fabricated.

As described above, according to the present embodiment, after the capacitor dielectric film has been formed, the capacitor dielectric film is never exposed to the etching atmosphere before the upper electrode is formed, whereby intra-distribution and fluctuation of the film thickness, and degradation of the film quality can be prevented.

[A Second Embodiment]

The capacitor and the method for fabricating the same according to a second embodiment of the present invention will be explained with reference to FIGS. 4A–4B, 5, 6A–6C and 7A–7C. The same members of the present embodiment as those of the capacitor and the method for fabricating the same according to the first embodiment shown, in FIGS. 1 to 3D are represented by the same reference numbers not to repeat or to simplify their explanation.

Figure 4A:
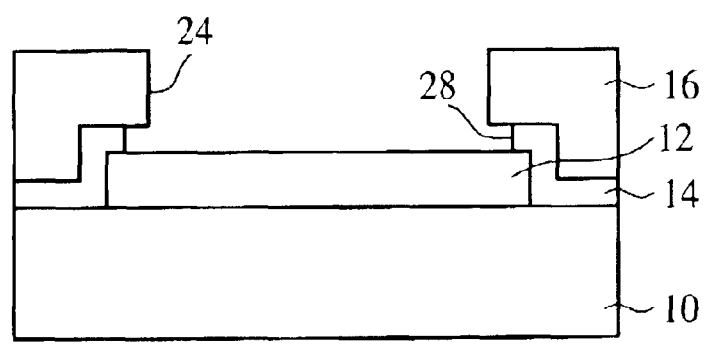
FIGS. 4A–4B are views explaining a problem of the method for fabricating the capacitor according to the first embodiment of the present invention.
Figure 4B:
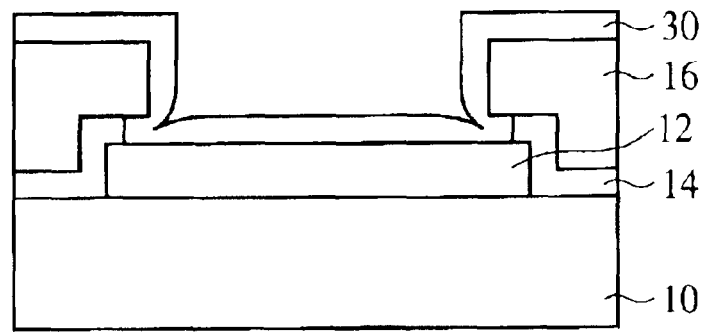
Figure 5:
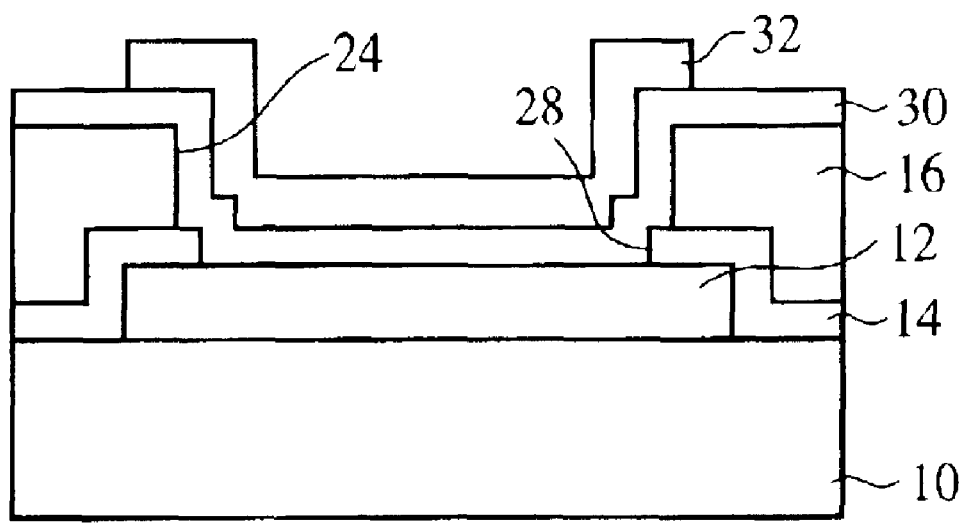
FIG. 5 is a diagrammatic sectional view of the capacitor according to a second embodiment of the present invention, which shows a structure thereof.

FIGS. 4A and 4B are sectional views of the capacitor explaining problems of the method for fabricating the capacitor according to the first embodiment. FIG. 5 is a diagrammatic sectional view of the capacitor according to the present embodiment, which shows a structure of the capacitor. FIGS. 6A–6C and 7A–7C are sectional views of the capacitor according to the present embodiment in the steps of the method for fabricating the same, which show the method.

In the capacitor and the method for fabricating the same according to the first embodiment, the capacitor dielectric film 30 is formed after the openings 24, 28 for exposing the lower electrode 12 have been formed, whereby the capacitor dielectric film is prevented from being damaged.

However, in the step of etching the silicon nitride film 14 to form the opening 28, depending on conditions of the etching, the silicon nitride film 14 is etched isotropically as well to resultantly side-etched as shown in FIG. 4A. In this case, when the capacitor dielectric film 30 is formed after such etching, the coverage of the capacitor dielectric film 30 is degraded at the side-etched part, which causes cracks, and there is a risk of possible lower breakdown voltage (FIG. 4B)

In the present embodiment, the capacitor and the method for fabricating the same which can prevent the coverage degradation of the capacitor dielectric film 30 is explained.

First, the structure of the capacitor according to the present embodiment will be explained with reference to FIG. 5.

A lower electrode 12 is formed on a substrate 10. A silicon nitride film 14 having an opening 28 on the lower electrode 12 is formed on the substrate 10 with the lower electrode 12 formed on. An inter-layer insulation film 16 having an opening 24 whose opening diameter is larger than the opening 28 is formed on the silicon nitride film 14. A capacitor dielectric film 30 is formed on the lower electrode 12 exposed in the opening 28, extended over the silicon nitride film 14 and the inter-layer insulation film 16. An upper electrode 32 is formed on the capacitor dielectric film 30.

As described above, the capacitor according to the present embodiment is characterized mainly in that the silicon nitride film 14 is partially exposed in a peripheral part of the opening 24 formed in the inter-layer insulation film 16, so that the capacitor dielectric film 30 has a larger effective film thickness at the peripheral part of the opening 24. The capacitor is thus structured, whereby the capacitor dielectric film 30 can be formed with good coverage over even the peripheral part of the opening 24, where the film quality tends to be degraded. The capacitor dielectric film 30 in the peripheral part can be thicker, whereby the generation of cracks can be prevented, and the capacitor dielectric film 30 can have higher reliability.

Then, the method for fabricating the capacitor according to the present embodiment will be explained with reference to FIGS. 6A–6C and 7A–7C.

Figure 6A:
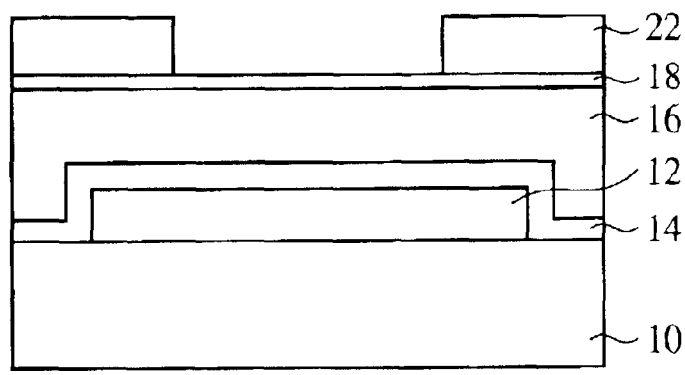
FIGS. 6A–6C and 7A–7C are sectional views of the capacitor according to the second embodiment of the present invention in the steps of the method for fabricating the same, which show the method.

First, in the same way as in, e.g., the method for fabricating the capacitor according to the first embodiment shown in FIGS. 2A to 2D, the lower electrode 12, the silicon nitride film 14, the inter-layer insulation film 16, the silicon nitride film 18 and the resist pattern 22 are formed on the substrate 10 (FIG. 6A).

Next, with the resist pattern 22 as a mask, the silicon nitride film 18 is anisotropically etched by plasma etching using, e.g., a fluorine-based gas to remove the silicon nitride film 18 in the opening 20.

Then, the resist pattern 22 is removed, and then with the patterned silicon nitride film 18 as a mask, the inter-layer insulation film 16 is anisotropically etched with a carbon-content etching gas to form the opening 24 reaching the silicon nitride film 14 in the inter-layer insulation film 16. The inter-layer insulation film 16 can be etched by plasma etching using a gas of, e.g., oxygen gas with a fluorocarbon-based gas, such as trifluoromethane ($CHF_3$), octafluorocyclobutane ($C_4F_8$) or others, added by 5–20%.

Figure 6B:
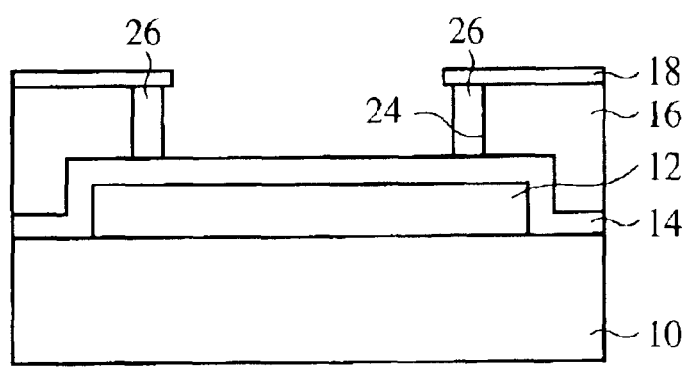

The inter-layer insulation film 16 is etched under the above-described conditions, whereby a polymer which is a by-product is produced in the reaction taking place in the etching adheres to the inside wall (the etched surface of the inter-layer insulation film 16) of the opening 24. Thus, a sidewall deposited film 26 of the 0.5 to 2 $\mu$m-thick polymer is formed (FIG. 6B).

The sidewall deposited film 26 can be formed on the inside wall of the opening 24 also by increasing the bias power for the etching to perform the etching under conditions approximate to ion milling.

Then, the silicon nitride film 18 and the silicon nitride film 14 exposed in the opening 24 are selectively etched by plasma etching using, e.g., fluorine-based gas. Thus, the silicon nitride film 18 is removed, and the opening 28 having a smaller opening diameter than the opening 24 is formed in the silicon nitride film 14 (FIG. 6C).

Figure 6C:
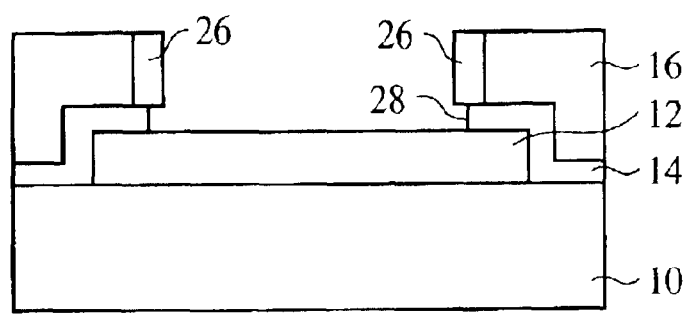

Depending on conditions of the etching, the silicon nitride film 14 is etched isotropically as well, and the structure that the sidewall deposited film 26 is extended like eaves over the silicon nitride film 14 is often formed as shown in FIG. 6C. In such case, it is preferable to control a film thickness of the sidewall deposited film 26, conditions of the etching, etc. so that the opening 28 to be formed in the silicon nitride film 14 can have a smaller opening diameter than the opening 24 to be formed in the inter-layer insulation film 16.

Figure 7A:
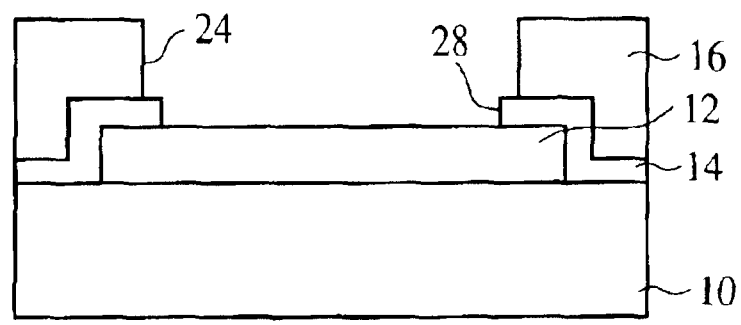

Next, the sidewall deposited film 26 is selectively removed by etching using, a polymer removing agent. Thus, a part of the upper surface of the silicon nitride film 14 is exposed in the opening 24 (FIG. 7A).

Figure 7B:
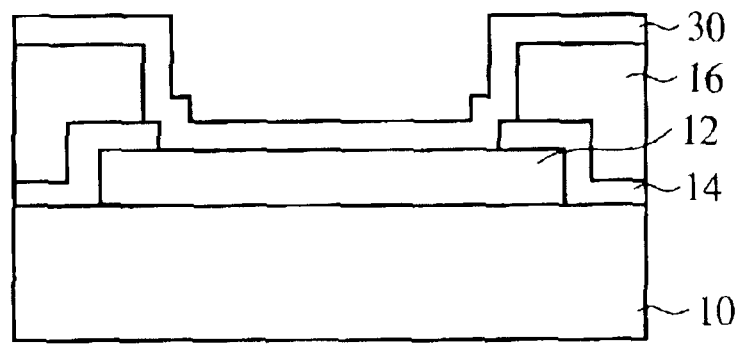

Then, a silicon nitride film of, e.g., a 200 nm-thick is deposited by, e.g., CVD method. Thus, the capacitor dielectric film 30 of the silicon nitride film is formed (FIG. 7B).

Then, an Au film of, e.g., a 1000 nm-thick is deposited on the capacitor dielectric film 30 by, e.g., sputtering method.

Figure 7C:
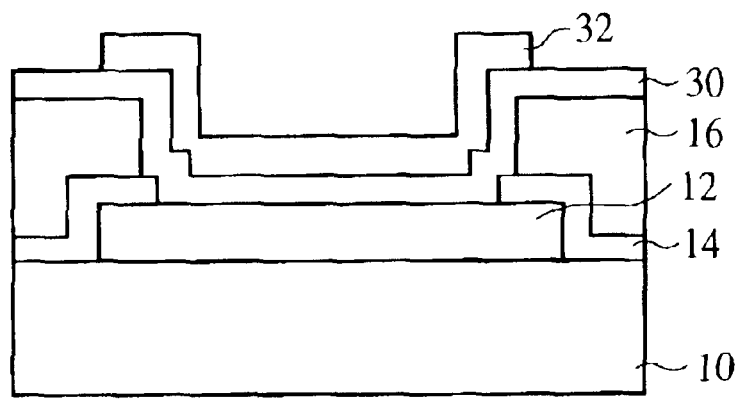

Next, the Au film is patterned to form the upper electrode 32 (FIG. 7C).

As described above, after the capacitor dielectric film 30 has been formed, the capacitor dielectric film 30 is never exposed to the etching atmosphere and damaged before the upper electrode 32 is formed.

As described above, according to the present embodiment, the capacitor dielectric film can have a larger effective thickness at a peripheral part of the opening, whereby no crack takes place even in the peripheral part of the opening where the film quality tends to be degraded. Accordingly, the capacitor dielectric film can be highly reliable in the breakdown voltage, stress resistance, etc. After the capacitor dielectric film 30 has been formed, the capacitor dielectric film 30 is never exposed to the etching atmosphere and damaged before the upper electrode 32 is formed, whereby disuniformity of the film thickness can be suppressed, and the capacitor dielectric film 30 have higher reliability.

In the present embodiment, the side etching takes place in etching the silicon nitride film 14 to form the opening 28. However, the method for fabricating the capacitor according to the present embodiment is applicable to a case where the silicon nitride film 14 is etched under conditions for causing no side etching. That is, the fabrication method according to the present embodiment is used, whereby the coverage of the capacitor dielectric film 30 at the peripheral part of the opening 28 is improved and can have accordingly improved reliability.

[A Third Embodiment]

The method for fabricating the capacitor according to a third embodiment of the present invention will be explained with reference to FIGS. 8A–8D. The same members of the present embodiment as those of the capacitor and the method for fabricating the same according to the first to the third embodiments shown in FIGS. 1 to 7C are represented by the same reference numbers not to repeat or to simplify their explanation.

FIGS. 8A–8D are sectional views of the capacitor in the steps of the method for fabricating the same according to the present embodiment, which show the method.

In the present embodiment, another method for fabricating the capacitor shown in FIG. 1 will be explained.

Figure 8A:
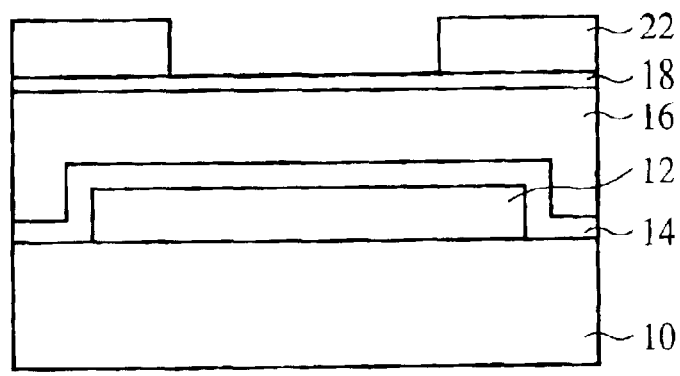
FIGS. 8A–8D are sectional views of the capacitor according to a third embodiment of the present invention in the steps of the method for fabricating the same, which show the method.

First, in the same way as in, e.g., the method for fabricating the capacitor according to the first embodiment shown in FIGS. 2A to 2D, the lower electrode 12, the silicon nitride film 14, the inter-layer insulation film 16, the silicon nitride film 18 and the resist pattern 22 are formed (FIG. 8A).

Then, with the resist pattern 22 as a mask, the silicon nitride film 18 is anisotropically etched by plasma etching using, e.g., a fluorine-based gas to remove the silicon nitride film 18 in the opening 20.

Figure 8B:
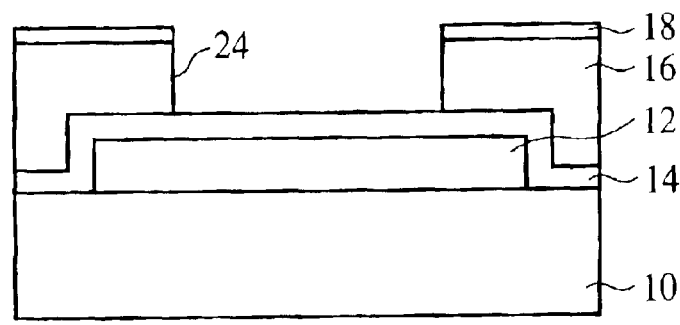

Next, after the resist pattern 22 has been removed, the inter-layer insulation film 16 is anisotropically etched by plasma etching using, e.g., oxygen gas with the patterned silicon nitride film 18 as a mask. Thus, the opening 24 reaching the silicon nitride film 14 is formed in the inter-layer insulation film 16 (FIG. 8B).

When the inter-layer insulation film 16 is etched under the above-described conditions, the sidewall deposited film 26 described in the second embodiment is not formed.

Next, the silicon nitride film 18, and the silicon nitride film 14 exposed in the opening 24, are etched by plasma etching using, e.g., a fluorine-based gas. Thus, the silicon nitride film 18 is removed, and the opening 28 is formed in the silicon nitride film 14 in the opening 24 (FIG. 8C).

Figure 8C:
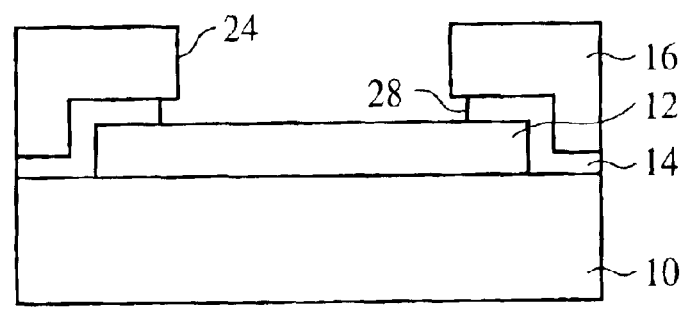

Depending on conditions of the etching, the silicon nitride film 14 is etched isotropically as well, and the structure that the inter-layer insulation film 16 is extended like eaves over the silicon nitride film 14 is often formed as shown in FIG. 8C. In this case, the opening 28 has a larger opening diameter than the opening 24.

Figure 8D:
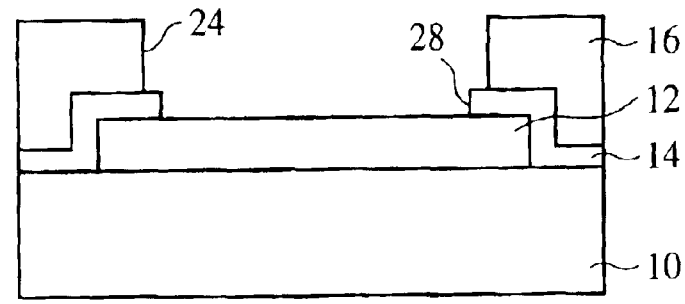

Then, the inter-layer insulation film 16 is slightly etched by etching having an isotropic etching component to make the opening diameter of the opening 24 larger than that of the opening 28. Thus, a part of the upper surface of the silicon nitride film 14 is exposed in the opening 24 (FIG. 8D). To isotropically etch the inter-layer insulation film 16, plasma etching using a gas of oxygen gas with a trace of a fluorine-based gas added to can be used. The inter-layer insulation film 16 is etched, e.g., with $CHF_3$ as a fluorine-based gas, a gas flow rate of $O_2/CHF_3$=30 sccm/3 sccm, at a chamber internal pressure of 2–4 Pa and at a 200 W radio-frequency electric power.

Then, in the same way as in, e.g., the method for fabricating the capacitor according to the second embodiment shown in FIGS. 7B and 7C, the capacitor dielectric film 30 and the upper electrode 32 are formed.

As described above, according to the present embodiment, the capacitor dielectric film can have a larger film thickness at a peripheral part of the opening, whereby no crack takes place in the peripheral part of the opening, where the film quality tends to be degraded. Accordingly, the capacitor dielectric film can be highly reliable in breakdown voltage and stress resistance. After the capacitor dielectric film has been formed, the capacitor dielectric film is never exposed to the etching atmosphere and damaged before the upper electrode is formed, whereby disuniformity of the film thickness can be suppressed, which makes the capacitor dielectric film have higher reliability.

[A Fourth Embodiment]

The capacitor and the method for fabricating the same according to a fourth embodiment of the present invention will be explained with reference to FIGS. 9 and 10A–10C. The same members of the present embodiment as those of the capacitor and the method for fabricating the same according to the first to the third embodiments shown in FIGS. 1 to 8D are represented by the same reference numbers not to repeat or to simplify their explanation.

Figure 9:
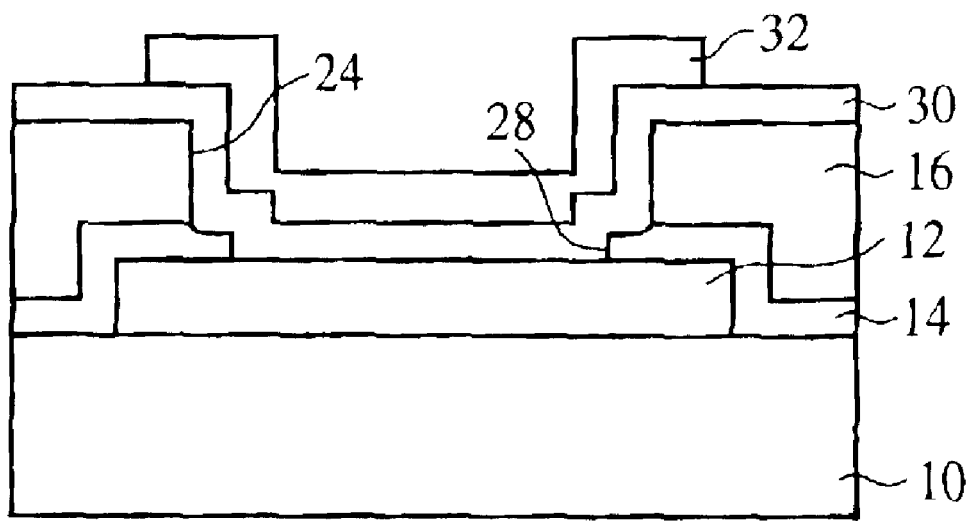
FIG. 9 is a diagrammatic sectional view of the capacitor according to a fourth embodiment of the present invention, which shows a structure thereof.
Figure 10A:
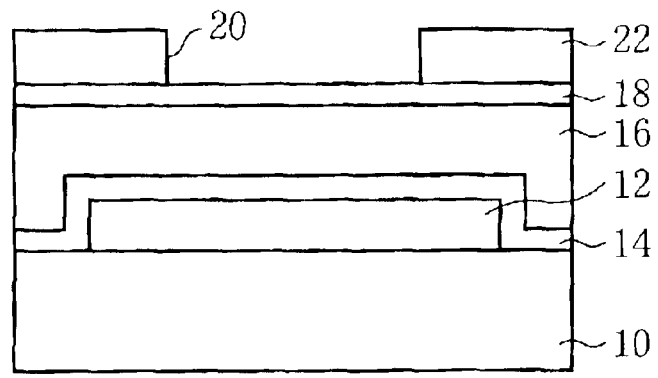
FIGS. 10A–10C are sectional views of the capacitor according to the fourth embodiment in the steps of the method for fabricating the same, which show the method.
Figure 10B:
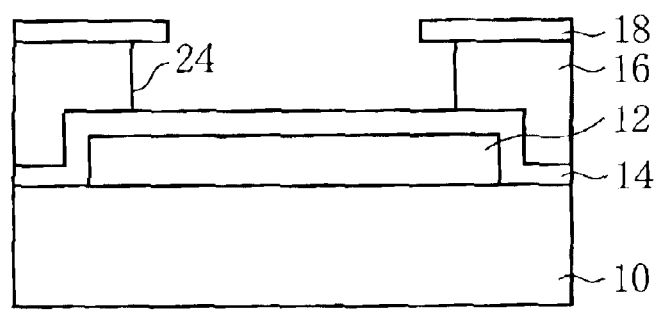
Figure 10C:
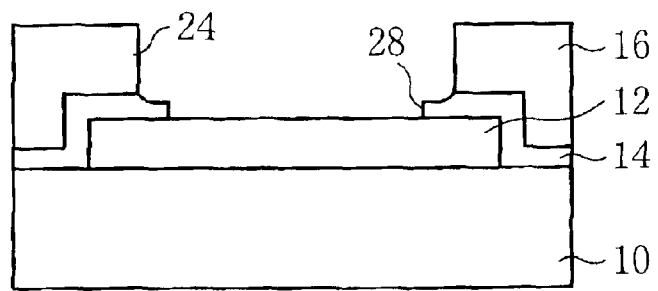

FIG. 9 is a diagrammatic sectional view of the capacitor according to the present embodiment, which shows a structure thereof. FIGS. 10A–10C are sectional views of the capacitor according to the present embodiment in the steps of the method for fabricating the same, which show the method.

First, the structure of the capacitor according to the present embodiment will be explained with reference to FIG. 9.

The capacitor according to the present embodiment is the same in the basic structure as the capacitor according to the first embodiment. A main characteristic of the capacitor according to the present embodiment is that the silicon nitride film 14 has a smaller film thickness in the opening 24 than below the inter-layer insulation film 16. This characteristic is based on a characteristic of the method for fabricating the capacitor according to the present embodiment.

Next, the method for fabricating the capacitor according to the present embodiment will be explained with reference to FIGS. 10A–10C.

First, in the same way as in, e.g., the method for fabricating the capacitor according to the first embodiment shown in FIGS. 2A to 2D, the lower electrode 12, the silicon nitride film 14, the inter-layer insulation film 16, the silicon nitride film 18 and the resist pattern 22 are formed on a substrate 10 (FIG. 10A). In the present embodiment, however, a film thickness of the silicon nitride film 18 is equal to or larger than that of the silicon nitride film 14. For example, both the silicon nitride film 14 and the silicon nitride film 18 have a 300 nm-thick.

Then, with the resist pattern 22 as a mask, the silicon nitride film 18 is anisotropically etched by plasma etching using, e.g., a fluorine-based gas to remove the silicon nitride film 18 in the opening 20.

Next, the resist pattern 22 has been removed, and then with the patterned silicon nitride film 18 as a mask, the inter-layer insulation film 16 is etched to form the opening 24 reaching the silicon nitride film 14 (FIG. 10B). At this time, the inter-layer insulation film 16 is etched with a gas of, e.g., oxygen gas with a trace of a fluorine-based gas added to. Thus, the inter-layer insulation film 16 is slightly etched isotropically as well to form the structure that the silicon nitride film 18 is extended like eaves over the inter-layer insulation film 16 as shown in FIG. 10B. The inter-layer insulation film 16 is side etched by, e.g., about 0.5–2 μm.

Then, the silicon nitride film 18, and the silicon nitride film 14 exposed in the opening 24 are anisotropically etched by plasma etching using, e.g., a fluorine-based gas. Thus, the silicon nitride film 18 is removed, and the opening 28 is formed in the silicon nitride film 14 in the opening 24 (FIG. 10C).

At this time, because the opening 24 in the inter-layer insulation film 16 is larger than that in the silicon nitride film 18, the silicon nitride film 14 is slightly etched also in the region where the eaves of the silicon nitride film 18 is formed. For example, when the silicon nitride films 14, 18 of a 300 nm-thick are etched by about 350 nm, the silicon nitride film 14 remains in an about 250 nm-thick below the eaves of the silicon nitride film 18.

Then, in the same way as in, e.g., the method for fabricating the capacitor according to the second embodiment shown in FIGS. 7B and 7C, the capacitor dielectric film 30 and the upper electrode 32 are formed.

As described above, according to the present embodiment, the capacitor dielectric film can have a larger effective thickness at a peripheral part of the opening, whereby no crack takes place even in the peripheral part of the opening where the film quality tends to be degraded. Accordingly, the capacitor dielectric film can be highly reliable in the breakdown voltage and stress resistance. After the capacitor dielectric film 30 has been formed, the capacitor dielectric film 30 is never exposed to the etching atmosphere and damaged before the upper electrode 32 is formed, whereby disuniformity of the film thickness can be suppressed, and the capacitor dielectric film 30 have higher reliability.

[A Fifth Embodiment]

The capacitor and the method for fabricating the same according to a fifth embodiment of the present invention will be explained with reference to FIGS. 11, 12A–12C and 13A–13B. The same members of the present embodiment as those of the capacitor and the method for fabricating the same according to the first to the fourth embodiments shown in FIGS. 1 to 10C are represented by the same reference numbers not to repeat or to simplify their explanation.

Figure 11:
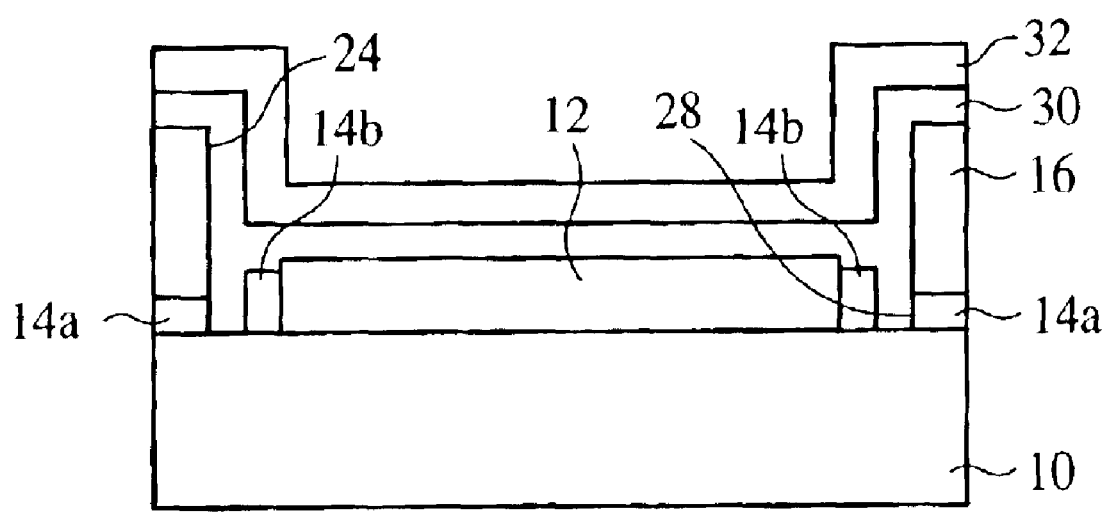
FIG. 11 is a diagrammatic sectional view of the capacitor according to a fifth embodiment of the present invention, which shows a structure thereof.

FIG. 11 is a diagrammatic sectional view of the capacitor according to the present embodiment, which shows a structure thereof. FIGS. 12A–12C and 13A–13C are sectional views of the capacitor according to the present embodiment in the steps of the method for fabricating the same, which show the method.

First, the structure of the capacitor according to the present embodiment will be explained with reference to FIG. 11.

A lower electrode 12 is formed on a substrate 10. A silicon nitride film 14 (silicon nitride film 14a) having an opening 28 in a region containing a region where the lower electrode 12 is formed is formed on the substrate 10 with the lower electrode 12 formed on. The silicon nitride film 14 (silicon nitride film 14b) is formed also on the side wall of the lower electrode 12. An inter-layer insulation film 16 having an opening 24 which has substantially the same opening diameter as the opening 28 is formed on the silicon nitride film 14a. On the lower electrode 12 exposed in the openings 24, 28, a capacitor dielectric film 30 is formed, extended over the silicon nitride film 14b and the inter-layer insulation film 16. An upper electrode 32 is formed on the capacitor dielectric film 30.

As described above, in the capacitor according to the present embodiment as well as in the capacitor according to the first embodiment, the silicon nitride film 14 in the opening 24 is removed, and the capacitor dielectric film 30 formed on the lower electrode 12 is formed, extended over the inter-layer insulation film 16. That is, in the capacitor according to the present embodiment, the openings 24, 28 are formed so as to reach the lower electrode 12 through the inter-layer insulation film 16 and the silicon nitride film 14, and then the capacitor dielectric film 30 is formed. Accordingly, the capacitor dielectric film 30 is never damaged in the step of forming the openings 24, 28, whereby intra-plane distribution and fluctuation of the film thickness, and degradation of the film quality can be prevented.

Furthermore, the openings 24, 28 are formed in the wide region containing the region where the lower electrode 12 is formed. Accordingly, even when a peripheral part of the opening 24 contains regions where the coverage of the capacitor dielectric film 30 is poor, the regions can be sufficiently spaced from the lower electrode 12 and the upper electrode 32. Accordingly, the capacitor dielectric film can be highly reliable in breakdown voltage, stress resistance, etc.

Then, the method for fabricating the capacitor according to the present embodiment will be explained with reference to FIGS. 12A–12C and 13A–13B.

Figure 12A:
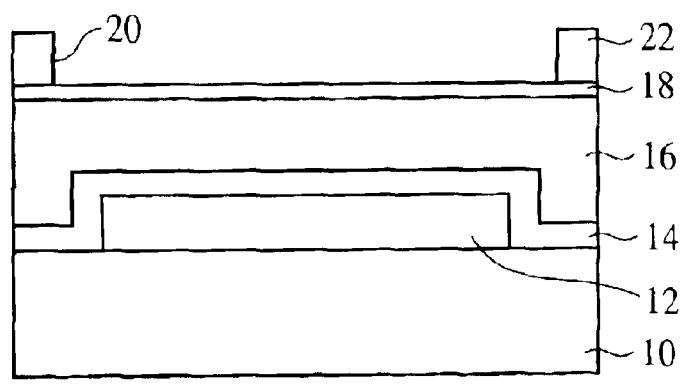
FIGS. 12A–12C and 13A–13B are sectional views of the capacitor according to the fifth embodiment of the present invention in the steps of the method for fabricating the same, which show the method.

First, in the same way as in, e.g., the method for fabricating the capacitor according to the first embodiment shown in FIGS. 2A to 2D, the lower electrode 12, the silicon nitride film 14, the inter-layer insulation film 16, the silicon nitride film 18 and the resist pattern 22 are formed on the substrate 10 (FIG. 12A). At this time, the opening 20 of the resist pattern has a region containing a region for the lower electrode 12 formed in.

Next, with the resist pattern 22 as a mask, the silicon nitride film 18 is anisotropically etched by plasma etching using, e.g., a fluorine-based gas to remove the silicon nitride film 18 in the opening 20.

Figure 12B:
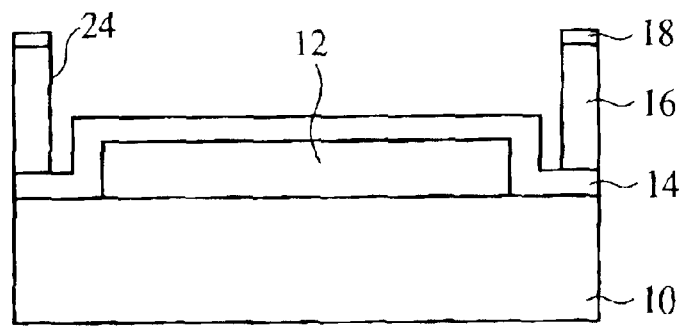

Then, after the resist pattern 22 has been removed, and then with the patterned silicon nitride film 18 as a mask, the inter-layer insulation film 16 is anisotropically etched by plasma etching using, e.g., oxygen gas. Thus, the opening 24 reaching the silicon nitride 14 is formed in the inter-layer insulation film 16 (FIG. 12B).

Figure 12C:
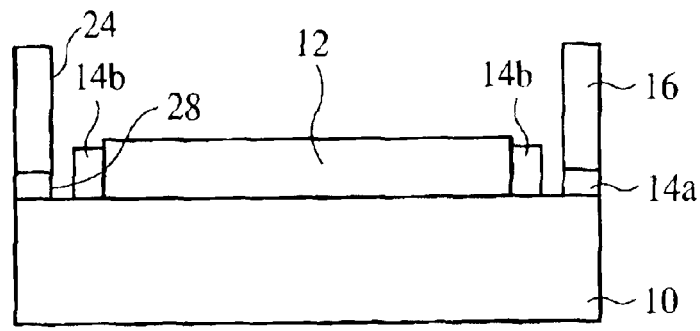

Then, the silicon nitride film 18, and the silicon nitride film 14 exposed in the opening 24 are etched by plasma etching using, e.g., a fluorine-based gas. Thus, the silicon nitride film 18 is removed, the silicon nitride film 14a having an opening 28 which is substantially equal to the opening 24, and the silicon nitride film 14b is formed on the side wall of the lower electrode 12 (FIG. 12C).

In this etching, even if the silicon nitride film 14a should be side-etched, the coverage degradation of the capacitor dielectric film 30 will not affect the capacitor characteristics because the silicon nitride film 14a is not positioned on the lower electrode 12.

Figure 13A:
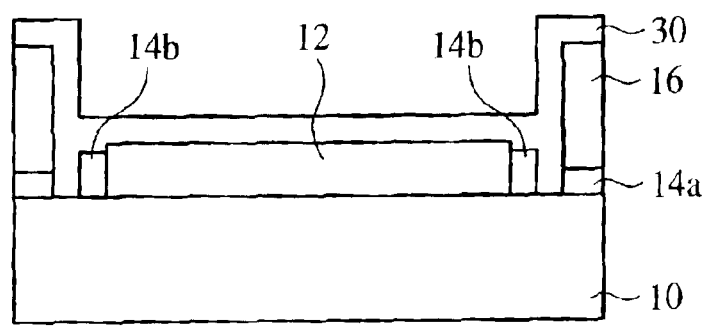

Then, a silicon nitride film of, e.g., a 200 nm-thick is deposited by, e.g., CVD method. Thus, the capacitor dielectric film 30 of the silicon nitride film is formed (FIG. 13A).

Next, An Au film of, e.g., a 1000 nm-thick is deposited on the capacitor dielectric film 30 by, e.g., sputtering method.

Figure 13B:
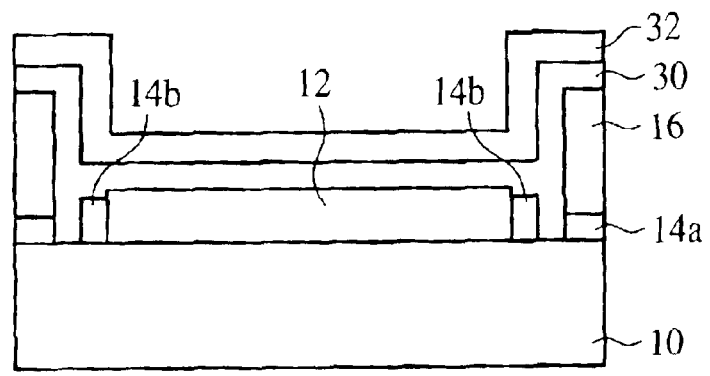
Figure 14A:
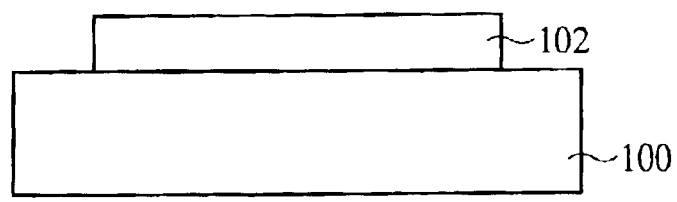
FIGS. 14A–14C and 15A–15B are sectional views of the conventional capacitor in the steps of the method for fabricating the same, which show the method.
Figure 14B:
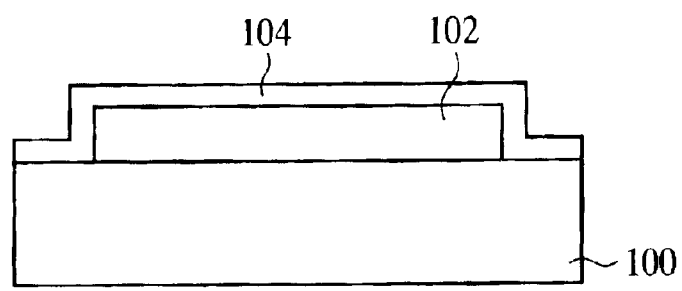
Figure 14C:
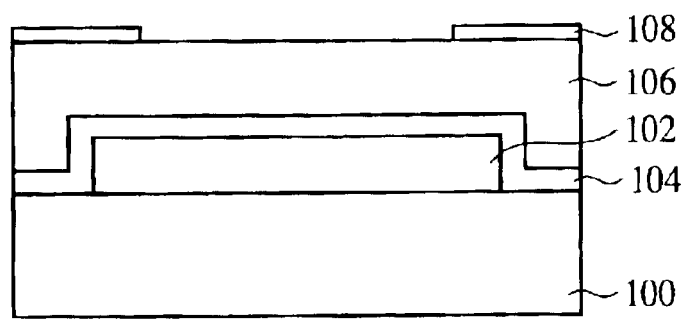
Figure 15A:
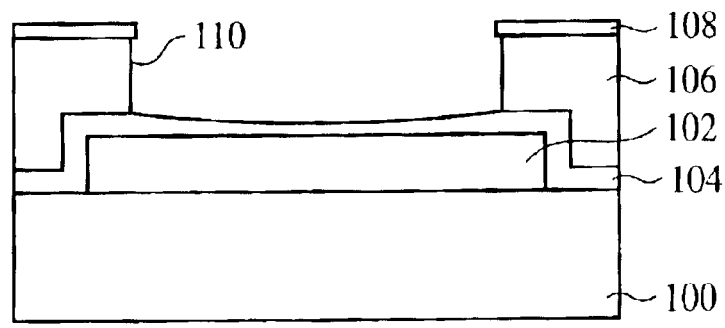
Figure 15B:
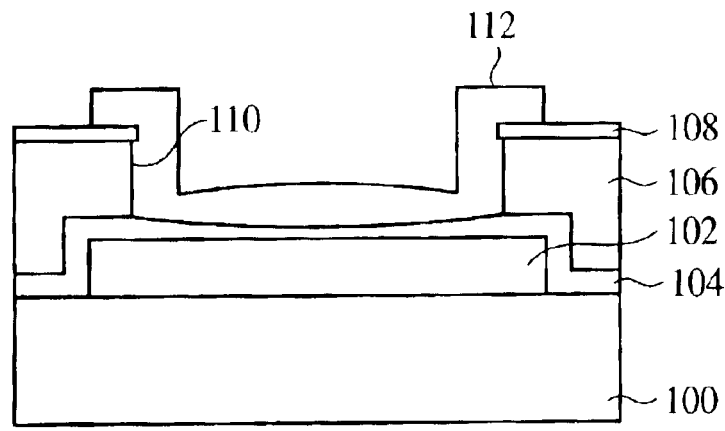

Next, the Au film is patterned to form the upper electrode 32 (FIG. 13B).

As described above, according to the present embodiment, after the capacitor dielectric film has been formed, the capacitor dielectric film is never exposed to the etching atmosphere before the upper electrode is formed, whereby the intra-distribution and fluctuation of the film thickness, and degradation of the film quality can be prevented. The opening 24 formed in the inter-layer insulation film 16 has a large region containing a region for the lower electrode 12 formed in, whereby even when a peripheral part of the opening 24 has parts of poor coverage of the capacitor dielectric film 30, the parts can be away from between the lower electrode 12 and the upper electrode 32. Accordingly, the capacitor dielectric film can be reliable in breakdown voltage, stress resistance, etc.

What is claimed is:

1. A capacitor comprising:
a lower electrode formed on a substrate;
a first insulation film formed on the substrate with the lower electrode formed on, and having a first opening on the lower electrode;
a second insulation film formed an the first insulation film, and having a second opening in a region where the first opening is formed, the second opening being larger than the first opening, and an upper surface of the first insulation film being exposed at the peripheral part of the second opening;
a capacitor dielectric film formed on the lower electrode in the opening, and extended over the second insulation film; and
an upper electrode formed on the capacitor dielectric film, and extended over the second insulation film.

2. A capacitor according to claim 1, wherein
a film thickness of the first insulation film in a region where the second opening is formed is thinner than that in a region below the second insulation film.

3. A capacitor according to claim 1, wherein
the first insulation film is a cover insulation film which covers an interconnection or an electrode formed on the substrate in a region different from a region where the lower electrode is formed.

4. A capacitor comprising:
a lower electrode formed on a substrate;
a first insulation film formed on the substrate with the lower electrode formed on, and having a first opening on the lower electrode;
a second insulation film formed on the first insulation film, and having a second opening in a region where the first opening is formed;
a capacitor dielectric film formed on the lower electrode in the first opening and extended over the second insulation film; and
an upper electrode formed on the capacitor dielectric film, and extended over the second insulation film,
the first opening and the second opening being formed in a region containing a region where the lower electrode is formed; and which further comprises:
a sidewall insulation film formed on a side wall of the lower electrode, the sidewall insulation film being formed of the same insulation film as the, first insulation film and spaced from the first insulation film.

5. A capacitor according to claim 4, wherein
the first insulation film is a cover insulation film which covers an interconnection or an electrode formed on the substrate in a region different from a region where the lower electrode is formed.

* * * * *